United States Patent
Arakawa (10) Patent No.: US 7,151,704 B2
(45) Date of Patent: Dec. 19, 2006

(54) SEMICONDUCTOR MEMORY DEVICE

(75) Inventor: Ken Arakawa, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 30 days.

(21) Appl. No.: 11/156,708

(22) Filed: Jun. 21, 2005

(65) Prior Publication Data

US 2005/0286324 A1    Dec. 29, 2005

(30) Foreign Application Priority Data

Jun. 23, 2004    (JP) .............................. 2004-184620

(51) Int. Cl.
*G11C 7/00*    (2006.01)
(52) U.S. Cl. ............. 365/200; 365/230.03; 365/189.01
(58) Field of Classification Search ................ 365/200, 365/201, 230.03, 230.06, 189.01
See application file for complete search history.

(56) References Cited

U.S. PATENT DOCUMENTS

| | | | |
|---|---|---|---|
| 5,694,369 A | 12/1997 | Abe | |
| 5,761,128 A * | 6/1998 | Watanabe | 365/189.01 |
| 6,414,896 B1 * | 7/2002 | Kim et al. | 365/230.03 |
| 6,418,067 B1 * | 7/2002 | Watanabe et al. | 365/200 |
| 6,563,732 B1 | 5/2003 | Matarrese et al. | |
| 6,601,199 B1 * | 7/2003 | Fukuda et al. | 714/719 |
| 2002/0101771 A1 * | 8/2002 | Lee et al. | 365/200 |

FOREIGN PATENT DOCUMENTS

| | | |
|---|---|---|
| JP | 08273365 | 10/1996 |
| JP | 09259589 | 10/1997 |

* cited by examiner

*Primary Examiner*—Gene N. Auduong
(74) *Attorney, Agent, or Firm*—Stevens, Davis, Miller & Mosher, LLP (57) ABSTRACT

Provided are a memory cell array, a column gate array, a row decoder, a column decoder, a sense amplifier array, a read data bus, an output buffer, and a redundancy discrimination signal bus. In the case of redundancy replacement, the output buffer outputs read data excluding the read data of a memory cell block serving as an object of redundancy replacement. In the case of no redundancy replacement, the output buffer outputs read data excluding the read data of a redundant memory cell block. Then, the read data excluded by the output buffer is provided to the output buffer as an output enable signal. The transition timing of the read data excluded by the output buffer is set to be later than that of the other read data.

8 Claims, 8 Drawing Sheets

SEMICONDUCTOR MEMORY DEVICE

BACKGROUND OF THE INVENTION

1. Field of the Invention

The present invention relates to a read circuit technique used for example in a rewritable semiconductor memory device provided with a redundant capacity in which an excessive electric current consumption in a data bus and a sense amplifier is controlled and suppressed so that overall electric current consumption is reduced.

2. Prior Art

In recent years, with the rise of environmental consciousness and the progress in portable electronic devices, the use of memory products having a low electric current consumption is growing. Nevertheless, the electric current consumption in an output data bus and a sense amplifier section tends to increase with increasing bit width and read speed. Thus, reduction is desired in such electric current consumption.

In a large capacity semiconductor memory device requiring a redundant capacity, in order that the influence of degradation in the read speed caused by redundancy replacement should be avoided, a redundancy replacement method with respect to bit configuration is effective. Further, for the purpose of reduction of the electric current consumption in the output data bus and the sense amplifier section, a timing control method is effective that employs a circuit called a dummy circuit or a replica circuit.

In a prior art configuration, a semiconductor memory device of this type comprises a dummy memory cell, a dummy bit line, and a dummy amplifier, so that timing control is performed using a read signal of the dummy amplifier (see, for example, Patent Document 1).

Figure 6:
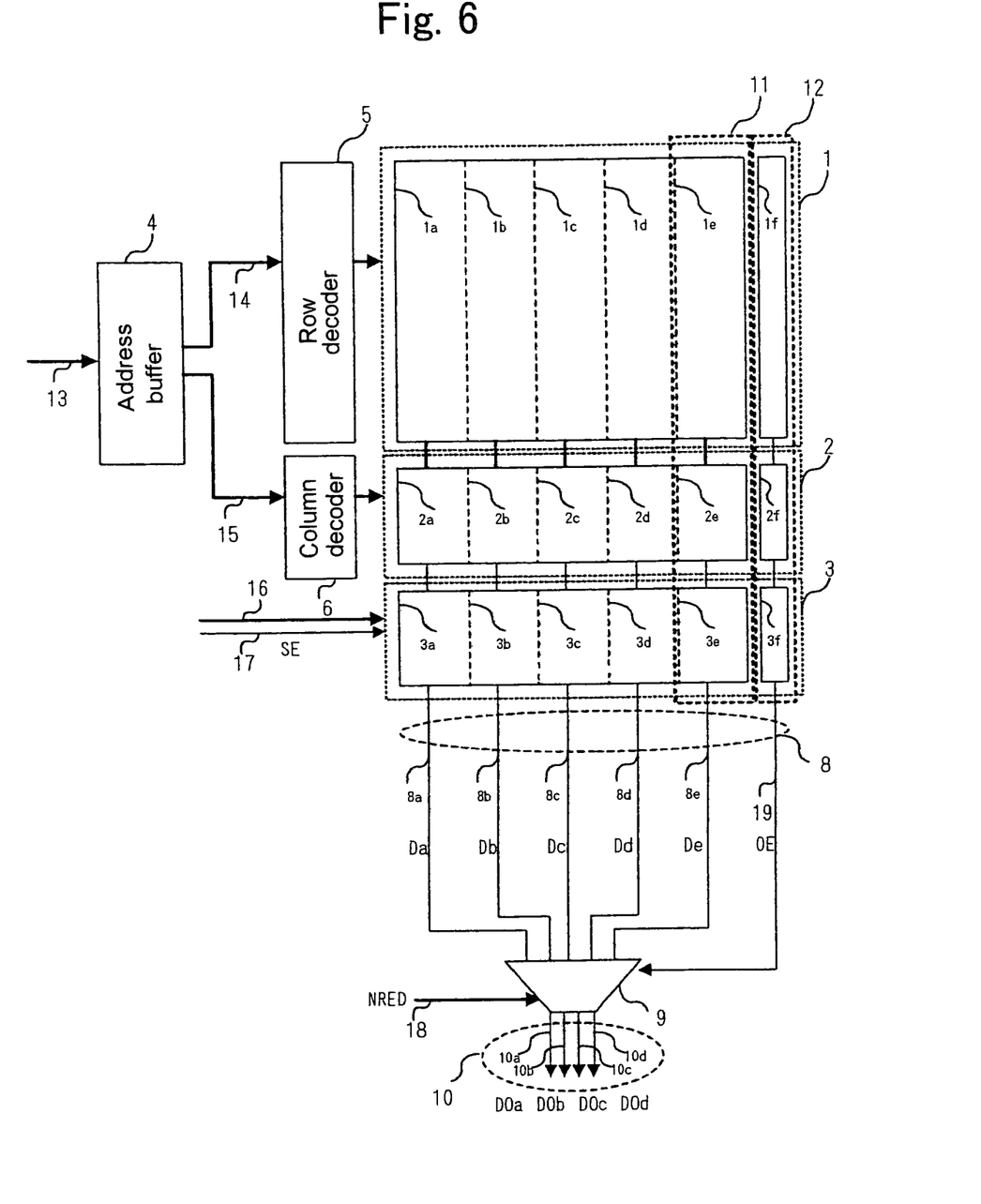
FIG. 6 is a block diagram showing the configuration of a read circuit of a prior art semiconductor memory device.

FIG. 6 is a block diagram showing an overall configuration of a prior art semiconductor memory device that has an external bit configuration specification of ×4 and an internal bit configuration of ×5 including redundancy and comprises a dummy circuit for timing control.

In FIG. 6, numeral 1 indicates a memory cell array. The memory cell array 1 comprises memory cell blocks 1a–1d, a redundant memory cell block 1e, and a dummy memory cell block 1f each of which is constructed from a plurality of word lines, a plurality of bit lines, and memory cells arranged at these nodes in the form of a matrix.

Numeral 2 indicates a column gate array. The column gate array 2 includes column gate blocks 2a–2d, a redundant column gate block 2e, and a dummy column gate block 2f.

Numeral 3 indicates a sense amplifier array. The sense amplifier array 3 includes sense amplifier blocks 3a–3d, a redundant sense amplifier block 3e, and a dummy sense amplifier block 3f.

Numeral 4 indicates an address buffer for receiving an address 13. Numeral 5 indicates a row decoder for receiving a row address 14 from the address buffer 4. Numeral 6 indicates a column decoder for receiving a column address 15 from the address buffer 4. Numeral 8 indicates a read data bus comprising read data lines 8a–8e and an output enable signal line 19. Numeral 9 indicates an output buffer. Numeral 10 indicates an output data bus comprising output data lines 10a–10d. Numeral 11 indicates a redundant block. Numeral 12 indicates a dummy block. Numeral 16 indicates a sense amplifier control signal bus. Numeral 17 indicates a sense amplifier activation signal line for inputting a sense amplifier activation signal SE. Numeral 18 indicates a redundancy discrimination signal bus.

Here, each unit composed of a memory cell block, a column gate block, and a sense amplifier block is defined as a block. The redundant memory cell block 1e, the redundant column gate block 2e, and the redundant sense amplifier block 3e constitute a redundant block 11. The dummy memory cell block 1f, the dummy column gate block 2f, and the dummy sense amplifier block 3f constitute a dummy block 12.

The redundant block 11 has a memory capacity smaller than or equal to that of the other blocks. Further, the dummy block 12 has a memory capacity smaller than that of the other blocks. The read data lines 8a–8e for outputting read data Da–De and the redundancy discrimination signal bus 18 for inputting a redundancy discrimination signal NRED for selecting the permission or inhibition of output of the read data Da–De to the outside are connected to the output buffer 9. The read data line of the dummy block 12, that is, the output enable signal line 19, is also connected to the output buffer 9. An output enable signal OE is provided through the output enable signal line 19 to the output buffer 9.

The address buffer 4 is connected to the row decoder 5 and the column decoder 6 such that a row address 14 and a column address 15 should be provided to the row decoder 5 and the column decoder 6, respectively.

The redundancy discrimination signal bus 18 for inputting a redundancy discrimination signal NRED comprises, specifically, five signal lines for inputting five signals consisting of a redundancy discrimination signal NREDa through a redundancy discrimination signal NREDe. In the case of no redundancy relief, the redundancy discrimination signal NREDe is solely at an L level, while the other four redundancy discrimination signals NREDa–NREDd are set at an H level. After the redundancy relief, in the block serving as an object of relief, the corresponding redundancy discrimination signal NREDx (x represents any one of a–d) is solely at an L level, while the other four redundancy discrimination signals NREDy (y represents a–d other than x) are set at an H level. The output buffer 9 outputs to the outside the read data of such a blocks each of which have the redundancy discrimination signals of H level among the redundancy discrimination signals NREDa–NREDe.

Figure 7:
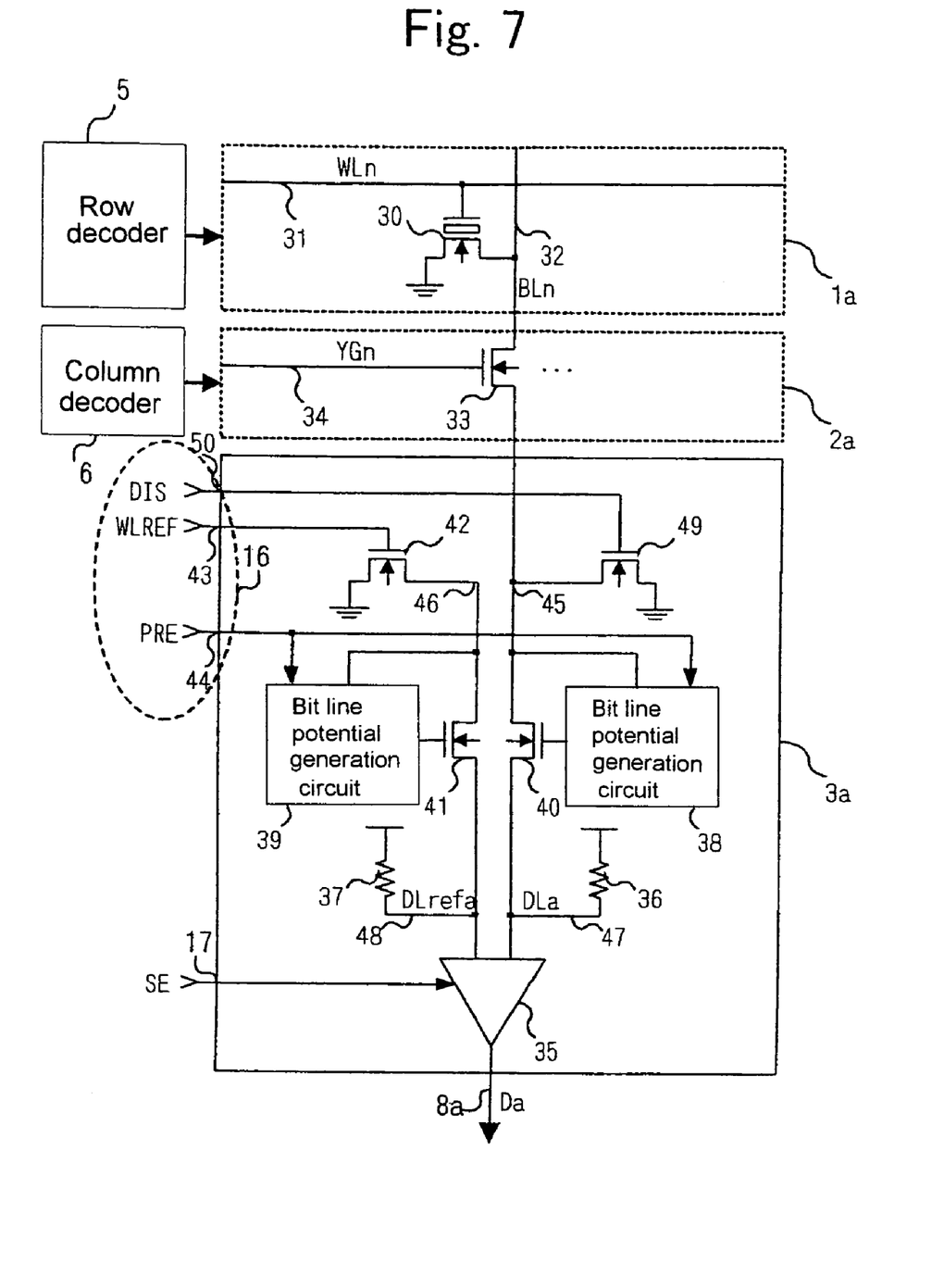
FIG. 7 is a circuit diagram showing the configuration of a prior art sense amplifier block.

FIG. 7 is a circuit diagram showing a detailed configuration of the memory cell block 1a, the column gate block 2a, and the sense amplifier block 3a of FIG. 6.

In FIG. 7, numeral 30 indicates a nonvolatile memory cell. Numeral 31 indicates a word line WLn representing a plurality of word lines. Numeral 32 indicates a bit line BLn representing a plurality of bit lines. Numeral 33 indicates a column gate transistor for selecting a bit line BLn. Numeral 34 indicates a column gate selection line YGn for selecting a column gate transistor 33. Numeral 35 indicates a differential amplifier circuit. Numerals 38 and 39 indicate bit line potential generation circuits. Numeral 42 indicates a reference memory cell.

The nonvolatile memory cell 30 is selected from among a plurality of nonvolatile memory cells by the word line WLn and the column gate selection line YGn, and thereby electrically connected to a node 45. NMOS transistors 40 and 41 are connected to nodes 45 and 46 as well as to a data line DLa indicated by numeral 47 and a reference data line DLrefa indicated by numeral 48. The drain of a discharging transistor 49 is connected to the node 45. The data line 47 and the reference data line 48 are connected to the inputs of the differential amplifier circuit 35. The row decoder 5 and the memory cell block 1a are interconnected through a plurality of word lines including the word line WLn. The column decoder 6 and the memory cell block 2a are interconnected through a plurality of column gate lines including the column gate selection line YGn.

The dummy block has the same configuration as FIG. 7 except that a fewer bit lines and a fewer column gates are provided. The data line corresponding to the node 47 is denoted by DLf, while the reference data line corresponding to the node 48 is denoted by DLreff.

The operation of the prior art semiconductor memory device having the above-mentioned configuration is described below with reference to FIGS. 6, 7, and 8.

Figure 8:
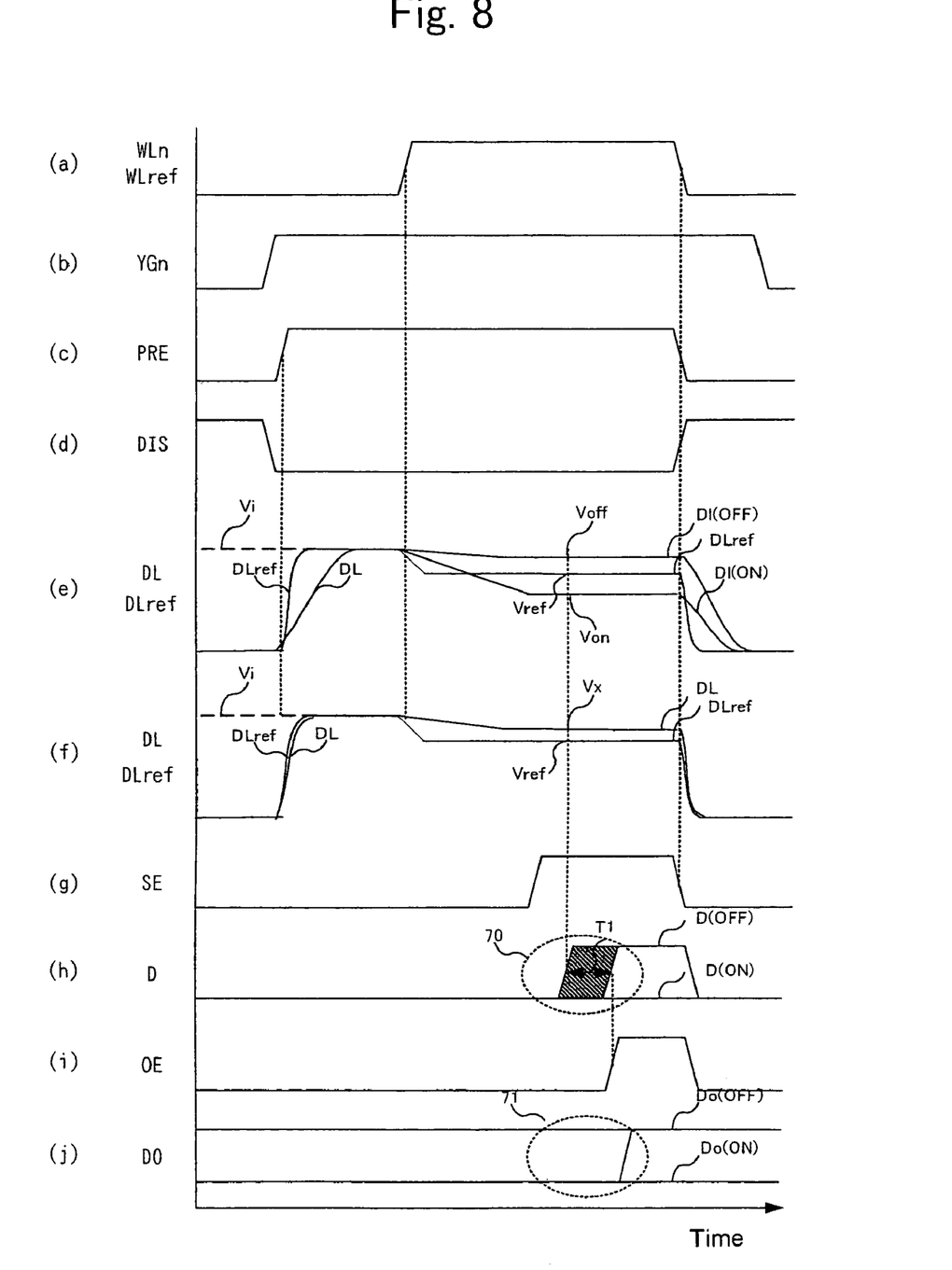
FIG. 8 is a timing chart showing a read operation in semiconductor memory devices of the prior art and FIGS. 1 and 2.

FIG. 8 is a timing chart for the prior art example shown in FIGS. 6 and 7. The following description is given for the case that the memory cell block 1a serves as an object of read.

First, the address buffer 4 predecodes an address 13 into a row address 14 and a column address 15. Then, the column decoder 6 selects a column gate line YGn as shown in FIG. 8(b).

Then, when a control signal PRE inputted through the signal line 44 in the sense amplifier control signal bus 16 goes to an H level as shown in FIG. 8(c), the bit line potential generation circuits 38 and 39 become activated. Thus, the bit line potential generation circuits 38 and 39 detects the potentials of the nodes 45 and 46 electrically connected respectively to the drain nodes of the nonvolatile memory cell 30 and the reference memory cell 42, and thereby perform feedback to the gate potentials of the NMOS transistors 40 and 41. As a result, the data line DLa indicated by numeral 47 and the reference data line DLrefa indicated by numeral 48 are charged into a certain potential Vi as shown in FIG. 8(e).

Then, as shown in FIG. 8(a), when the row decoder 5 causes the word line WLn to go to an H level, and when the control signal WLref inputted through the signal line 43 in the sense amplifier control signal bus 16 goes to an H level, the nonvolatile memory cell 30 and the reference memory cell 42 which is an NMOS load element are activated. As a result, the nonvolatile memory cell 30 and the reference memory cell 42 begin to reduce the potentials of the nodes 45 and 46.

After a certain time has elapsed, the potentials of the nodes 45 and 46 reach a stable state. At that time, the bit line potential generation circuits 38 and 39 retain the data line DLa and the referenced at a line DLrefa at a potential Voff/Von and a potential Vref, respectively, as shown in FIG. 8(e). Here, the potential Voff and the potential Von correspond respectively to the OFF state and the ON state of the nonvolatile memory cell 30.

Further, the data line DLf and the reference data line DLreff in the dummy sense amplifier block 3f having a configuration similar to FIG. 6 have a potential Vx and a potential Vref, respectively, as shown in FIG. 8(f).

Here, the potential Vx is set up such that the following relations hold for these potentials.

|Von−Vref|>|Vx−Vref|

|Voff−Vref|>|Vx−Vref|

Further, in order that these relations should hold in each block, the potential Vx can be adjusted by the layout of the bit line of the dummy memory cell block 1f and by the cell current value of the memory cell. That is, the input potential difference to the differential amplifier circuit of the dummy memory cell block 1f is set to be the minimum among the input potential differences to the differential amplifier circuit of all the blocks.

Then, as shown in FIG. 8(g), when a sense amplifier activation signal SE inputted through the sense amplifier activation signal line 17 goes to an H level, |Von−Vref| or |Voff−Vref| is amplified by the differential amplifier circuit in the sense amplifier block 3a, while |Vx−Vref| is amplified by the differential amplifier circuit in the dummy sense amplifier block 3f.

Then, read data Da is outputted from the differential amplifier circuit 35 as shown in FIG. 8(h), while read data of the dummy block 12 is outputted as an output enable signal OE from the differential amplifier circuit of the dummy sense amplifier block 3f as shown in FIG. 8(i). The output enable signal OE is data generated by reading the dummy memory cell block having the minimum input potential difference to the differential amplifier circuit, and hence is outputted later than the read data of any other blocks.

Then, as shown in FIG. 8(d), when a control signal DIS inputted through the signal line 50 in the sense amplifier control signal bus 16 goes to an H level, the discharging transistor 49 becomes activated so that the bit line BLn and the node 45 are discharged to the ground potential. Thus, the read operation is completed.

In the case that a variation arises in the load capacitance or the current capability owing to a fabrication variation in the memory cells, the word lines, the bit lines, the data lines, and the differential amplifier circuits, an unstable operation or a malfunctioning occurs during the time after each differential amplifier circuit starts amplifying operation and before a sufficient input potential difference is generated between the data line and the reference data line. This unstable operation or malfunction generates a data uncertainty duration T1 for the read data Da or the other read data Db–De as indicated by numeral 70 in FIG. 8(h).

If the read data were outputted to the outside during the uncertainty duration T1, various problems could arise such as a degradation in the read speed, an increase in the penetration current in the output buffer 9, and an increase in the charge or discharge current of the load capacitance attached to the output data bus. Thus, in order that the transition should occur after the uncertainty duration T1 as shown in FIG. 8(i), the output buffer 9 is controlled by the output enable signal OE having been set to be outputted later than all the read data. As a result, the output buffer 9 is prevented from performing the output operation to the outside in the uncertainty duration T1. As such, as indicated by numeral 71 in FIG. 8(j), the output data DOa–DOd is outputted without an uncertainty duration.

In the output buffer 9, a bus switching operation is performed such that the read data corresponding to blocks having redundancy discrimination signals of H level among the redundancy discrimination signals NREDa–NREDe should be outputted.

Patent Document 1; JP-A No. H8-273365

However, in the semiconductor memory device employing the prior art read circuit described above, the incorporation of the dummy memory cell block has caused the problem of an increase in the area and the fabrication cost.

SUMMARY OF THE INVENTION

An object of the invention is to provide a semiconductor memory device in which under the conditions that an increase in the area is suppressed and that the read speed is not degraded, an output buffer (read data outputting means) can output data without an uncertainty duration at a low electric current consumption.

Another object of the invention is to provide a semiconductor memory device in which under the condition that an increase in the area is suppressed, the duration that electric current consumption occurs in a sense amplifier circuit is minimized.

Another object of the invention is to provide a semiconductor memory device in which under the conditions that an increase in the area is suppressed and that no influence arises from the cell current amount of a memory cell block serving as an object of redundancy replacement or from the contents of defect of the memory cell block, an output buffer outputs data without an uncertainty duration at a low electric current consumption, so that the duration that electric current consumption occurs in a sense amplifier circuit is minimized.

Another object of the invention is to provide a semiconductor memory device in which under the conditions that an increase in the area is suppressed and that no influence arises from the cell current control of a memory cell block serving as an object of redundancy replacement or from the contents of defect of the memory cell block, timing adjustment can be performed in order that an output buffer should output data without an uncertainty duration at a low electric current consumption, while the duration that electric current consumption occurs in a sense amplifier circuit can be adjusted.

Another object of the invention is to provide a semiconductor memory device in which under the condition that no influence arises from the cell current amount of a memory cell block serving as an object of redundancy replacement or from the contents of defect of the memory cell block, the influence of an increase in the circuit area is suppressed.

Another object of the invention is to provide a semiconductor memory device in which a product article which could be rejected because of its degraded speed can be recovered by inactivating the function of controlling output data.

According to the invention, in a semiconductor memory device employing a redundancy replacement method with respect to bit configuration, regardless of the actual execution or not of redundancy replacement, an unused circuit is effectively used as a dummy circuit so that the above-mentioned objects are achieved with suppressing an increase in the area.

A semiconductor memory device according to the invention comprises: a plurality of memory cell blocks including a redundant memory cell block; selecting means for selecting one memory cell from each of the memory cell blocks depending on an inputted address; plural pieces of amplifying means each provided in correspondence to each of the memory cell blocks so as to read data of the memory cell selected by the selecting means; a plurality of data buses each connected to each of plural pieces of the amplifying means; read data outputting means for outputting plural pieces of read data through a plurality of the data buses to the outside; and redundancy discrimination signal inputting means for inputting a redundancy discrimination signal for discriminating a memory cell block serving as an object of redundancy replacement among a plurality of the memory cell blocks.

Then, in response to the redundancy discrimination signal, in the case of redundancy replacement, the read data outputting means outputs read data excluding the read data of the memory cell block serving as an object of redundancy replacement, while in the case of no redundancy replacement, the read data outputting means outputs read data excluding the read data of the redundant memory cell block among a plurality of the memory cell blocks. Further, the read data excluded by the read data outputting means is used as a memory control signal.

For example, the memory control signal described above is inputted to the read data outputting means as an output enable signal. Then, the output enable signal controls the external output of the read data from the read data outputting means.

Alternatively, the memory control signal described above may be inputted to plural pieces of amplifying means as an activation signal. Then, the activation signal controls the operation of plural pieces of the amplifying means.

In the above-mentioned semiconductor memory device according to the invention, in the case of redundancy replacement, cell current amount control is performed for the memory cells of the memory cell block serving as an object of redundancy replacement, while in the case of no redundancy replacement, cell current amount control is performed for the memory cells of the redundant memory cell block.

Then, in the case of redundancy replacement, the cell current amount control for the memory cells permits the adjustment of the timing of fixing the polarity of the read data from the memory cell block serving as an object of redundancy replacement, that is, the read data excluded by the read data outputting means. Further, in the case of no redundancy replacement, the cell current amount control for the memory cells permits the adjustment of the timing of fixing the polarity of the read data from the redundant memory cell block, that is, the read data excluded by the read data outputting means. That is, the timing of the memory control signal can be adjusted. Preferably, the transition timing of this memory control signal is later than that of the other read data.

For example, when the memory control signal is inputted to the read data outputting means as an output enable signal, the output enable signal controls the external output of the read data from the read data outputting means. Further, when the memory control signal is inputted to plural pieces of the amplifying means as an activation signal, the activation signal controls the operation of plural pieces of the amplifying means.

In the case that cell current amount control is performed for the memory cells as described above, in a preferable example, the semiconductor memory device according to the invention comprises cell current amount control discrimination signal inputting means for inputting a cell current amount control discrimination signal for discriminating the permission or inhibition of a read operation after the cell current amount control in correspondence to each of the memory cell blocks, and further comprises a plurality of dummy elements each connected to an input terminal of each of plural pieces of the amplifying means in correspondence to each of plural pieces of the amplifying means.

In this semiconductor memory device, in the case of redundancy replacement, solely in the memory cell block serving as an object of redundancy replacement, a drain node of a selected memory cell is electrically disconnected from the input terminal of the amplifying means corresponding to the memory cell block serving as an object of redundancy replacement among plural pieces of the amplifying means, in response to the redundancy discrimination signal and the cell current amount control discrimination signal. Further, in the case of no redundancy replacement, solely in the redundant memory cell block, a drain node of the selected memory cell is electrically disconnected from the input terminal of the amplifying means corresponding to the redundant memory cell block among plural pieces of the amplifying means in response to the redundancy discrimination signal and the cell current amount control discrimination signal. Then, the dummy element connected to the amplifying means the input terminal of which is electrically disconnected from the drain node of the selected memory cell is solely activated in a read duration.

Preferably, each of the dummy elements described above is composed, for example, of a transistor, while an internal generation potential is provided to the transistor as a gate voltage so that the current amount of each dummy element is adjusted. Further, a plurality of the dummy elements described above are activated after the completion of a read duration.

In the above-mentioned semiconductor memory device according to the invention, in the case that the read data excluded by the read data outputting means, that is, the memory control signal, is used as an output enable signal to the read data outputting means, in a preferable example, the redundancy discrimination signal and the output enable signal are inputted through external input terminals, and thereby control the read data outputting means, so that read data containing the excluded read data is selectively outputted to the outside.

The operation is described below that is acquired in each piece of the means described above.

According to these configurations, under the condition that a degradation is prevented in the read speed, the read data outputting means (output buffer) can output data without an uncertainty duration. This reduces the electric current consumption in the read data outputting means.

Further, in the control of activation or inactivation of the amplifying means (sense amplifier), the output enable signal is fed back. This allows the amplifying means to be inactivated immediately after the output of the read data, and hence reduces the electric current consumption in the amplifying means.

Further, even in the case of defect in the cell current amount control and defect in the memory cell block serving as an object of redundancy replacement, under the condition that a degradation is prevented in the read speed, the read data outputting means (output buffer) can output data without an uncertainty duration. This reduces the electric current consumption in the read data outputting means or the amplifier circuit (sense amplifier).

Further, regardless of the contents of defect in the memory cell block serving as an object of cell current amount control or redundancy replacement, under the condition that a degradation is prevented in the read speed, the timing can be adjusted that the read data outputting means outputs data without an uncertainty duration. This reduces the electric current consumption in the read data outputting means or the amplifying means.

Further, under the condition that a degradation is prevented in the read speed, the dummy element serving as means for allowing the read data outputting means to output data without an uncertainty duration can be shared as a discharging element for bit line. This suppress an increase in the area, and reduces the electric current consumption in the read data outputting means or the amplifying means.

Further, the output enable signal and the output data can be outputted to the outside. This permits before-the-shipment check of the presence or absence of speed degradation.

As described above, according to the invention, in a semiconductor memory device having redundancy, in response to a redundancy discrimination signal, the read data outputting means in the case of redundancy replacement outputs read data excluding the read data of the memory cell block serving as an object of redundancy replacement, while in the case of no redundancy replacement, the read data outputting means outputs read data excluding the read data of the redundant memory cell block. Then, the read data excluded by the read data outputting means is used as a memory control signal. This realizes an outstanding semiconductor memory device in which under the condition that an increase in the area is suppressed without the necessity of a dummy block, a memory control signal having an appropriate timing is generated.

Further, according to the invention, in a semiconductor memory device having redundancy, in response to a redundancy discrimination signal, the read data outputting means in the case of redundancy replacement outputs read data solely with excluding the read data of the memory cell block serving as an object of redundancy replacement, while in the case of no redundancy replacement, the read data outputting means outputs read data solely with excluding the read data of the redundant memory cell block. Then, the read data excluded by the read data outputting means controls the external output of the read data. This realizes an outstanding semiconductor memory device in which under the condition that an increase in the area is suppressed without the necessity of a dummy block, the output buffer outputs data without an uncertainty duration without a degradation in the read speed at a low electric current consumption.

Further, according to the invention, in a semiconductor memory device having redundancy, in response to a redundancy discrimination signal, the read data outputting means in the case of redundancy replacement outputs read data solely with excluding the read data of the memory cell block serving as an object of redundancy replacement, while in the case of no redundancy replacement, the read data outputting means outputs read data solely with excluding the read data of the redundant memory cell block. Then, the read data excluded by the read data outputting means controls the amplifying means. This realizes an outstanding semiconductor memory device in which under the condition that an increase in the area is suppressed without the necessity of a dummy block, the amplifying means is inactivated immediately after the fixing of the read data, so that the electric current consumption is reduced.

Further, according to the invention, a cell current amount control discrimination signal is provided for discriminating the permission or inhibition of a read operation for each memory cell block after the cell current amount control, while a dummy element connected to the input terminal of amplifying means is provided in each of plural pieces of amplifying means. In the case of redundancy replacement, solely in the memory cell block serving as an object of redundancy replacement, the drain node of a selected memory cell and the input terminal of the amplifying means are electrically disconnected by the redundancy discrimination signal and the cell current amount control discrimination signal. In the case of no redundancy replacement, solely in the redundant memory cell block, the drain node of the selected memory cell and the input terminal of the amplifying means are electrically disconnected by the redundancy discrimination signal and the cell current amount control discrimination signal. Then, the dummy element connected to the amplifying means the input terminal of which is electrically disconnected from the drain node of the selected memory cell is solely activated in a read duration. This realizes an outstanding semiconductor memory device in which under the conditions that no influence arises from the cell current amount of the memory cell block serving as an object of redundancy replacement or from the contents of defect of the memory cell block and that an increase in the area is suppressed without the necessity of a dummy block, the output buffer outputs data without an uncertainty duration without a degradation in the read speed at a low electric current consumption, while the electric current consumption in the sense amplifier circuit is minimized.

Further, the invention realizes an outstanding semiconductor memory device in which the current amount of the dummy element is adjusted so that a fabrication variation is corrected and that a yield degradation caused by a read speed degradation and an electric current consumption increase is suppressed.

Further, the invention realizes an outstanding semiconductor memory device in which the dummy element is activated after the completion of a read duration so that the size of the bit line discharging transistor is reduced and that a read speed degradation and an electric current consumption increase are suppressed.

Further, the invention realizes an outstanding semiconductor memory device in which read data containing the excluded read data is selectively outputted to the outside so that the output data waveform and the output enable signal waveform are observed in inspection. Then, a product article which could be rejected because of a speed degradation caused by a fabrication variation can be recovered by inactivating the function of controlling output data.

DETAILED DESCRIPTION OF THE PREFERRED EMBODIMENTS (Embodiment 1)
Embodiment 1 of the invention is described below with reference to the drawings.

Figure 1:
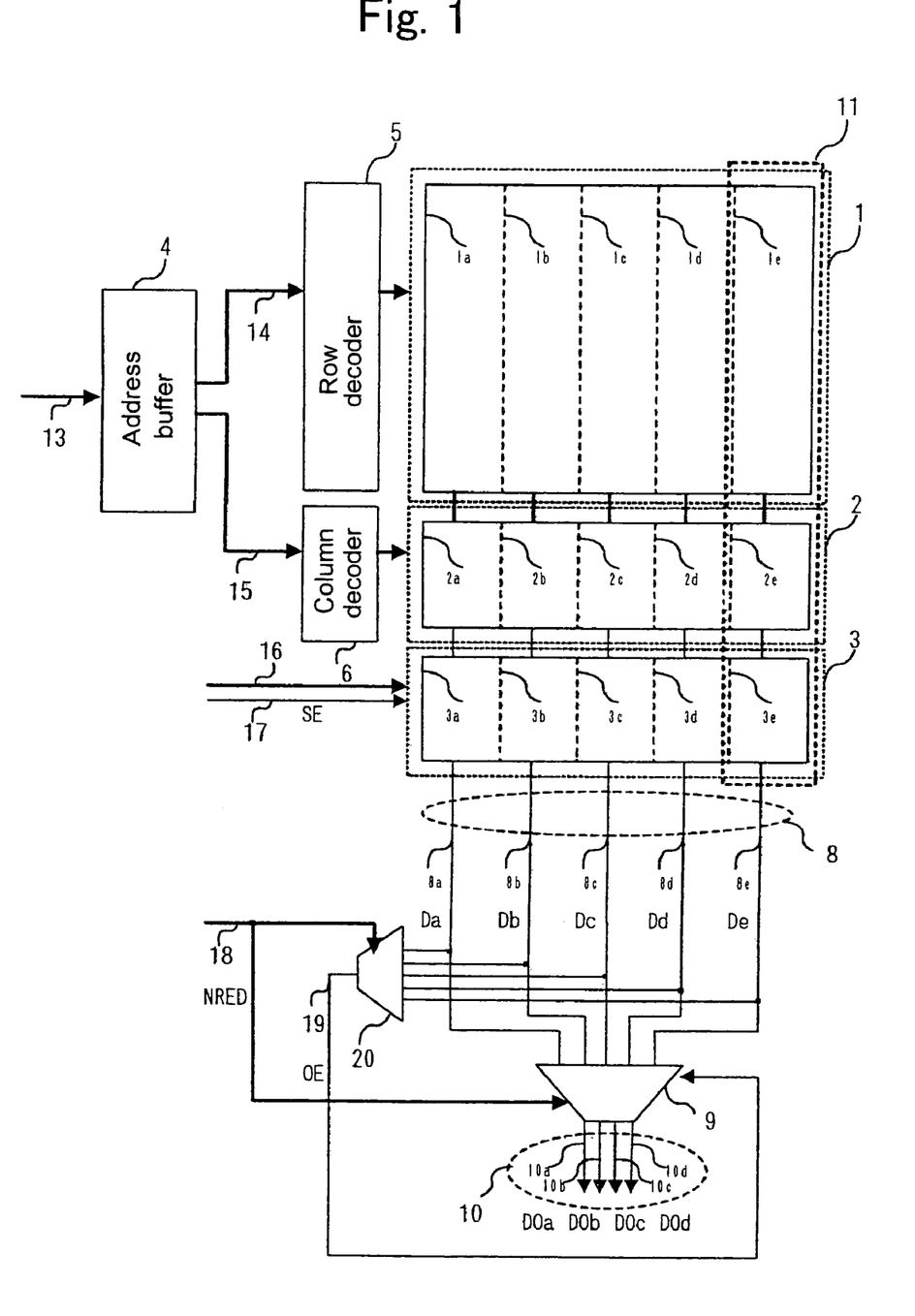
FIG. 1 is a block diagram showing the configuration of a read circuit of a semiconductor memory device according to Embodiment 1 of the invention in which electric current consumption is reduced in outputting means.

FIG. 1 shows a block diagram of a read circuit of a semiconductor memory device according to Embodiment 1 of the invention. This semiconductor memory device has an external bit configuration specification of ×4 and an internal bit configuration of ×5 including redundancy.

In FIG. 1, numeral 1 indicates a memory cell array. Numeral 2 indicates a column gate array. Numeral 3 indicates a sense amplifier array. Numeral 4 indicates an address buffer. Numeral 5 indicates a row decoder. Numeral 6 indicates a column decoder. Numeral 8 indicates a read data bus. Numeral 9 indicates an output buffer. Numeral 10 indicates an output data bus. The output data bus 10 comprises four output data lines 10a–10d for outputting four pieces of output data DOa–DOd. The present semiconductor memory device has the same configuration as the prior art example except for the absence of a dummy memory cell block, a dummy column gate block, and a dummy sense amplifier block. Numeral 20 indicates an output enable signal selection circuit. The output enable signal selection circuit 20 is a component absent in the prior art example.

Similarly to the prior art example, each block and the redundant block 11 are constructed from a completely identical circuit and in a completely identical layout. The read data lines 8a–8e and the redundancy discrimination signal bus 18 are connected to the output buffer 9 and the output enable signal selection circuit 20. The output enable signal line 19 which is the output line of the output enable signal selection circuit 20 is connected to the output buffer 9. Then, an output enable signal OE is provided through the output enable signal line 19 to the output buffer 9.

Further, similarly to the prior art example, the address buffer 4 outputs a row address 14 and a column address 15, and thereby inputs the addresses into the row decoder 5 and the column decoder 6.

Further, similarly to the prior art example, a level is set up for a redundancy discrimination signal NRED inputted through the input redundancy discrimination signal bus 18. The output buffer 9 is constructed similarly to the prior art example.

In the configuration, the output enable signal selection circuit 20 outputs solely the read data of the block corresponding to the redundancy discrimination signal NRED of L level, as an output enable signal OE.

The example of detailed configuration of the memory cell block 1a, the column gate block 2a, the sense amplifier block 3a, the row decoder 5, and the column decoder 6 of FIG. 1 is similar to that of FIG. 7.

The operation of the semiconductor memory device having the above-mentioned configuration according to the present embodiment is described below with reference to FIGS. 1, 7, and 8.

FIG. 8 is a timing chart for the example of FIGS. 1 and 7. The following description is given for the case that the memory cell block 1a serves as an object of redundancy replacement similarly to the prior art example.

Similarly to the prior art example, the redundant block 11 has a configuration similar to FIG. 7. The data line corresponding to the node 47 is denoted by DLe, while the reference data line corresponding to the node 48 is denoted by DLrefe.

First, similarly to the prior art example, when the address 13 is predecoded, a column gate line YGn is selected by the column decoder 6 as shown in FIG. 8(b).

Then, similarly to the prior art example, when a control signal PRE which belongs to a group of control signals inputted through the sense amplifier control signal bus 16 goes to an H level as shown in FIG. 8(c), the data line DLe and the reference data line DLrefe are charged into a certain potential Vi as shown in FIG. 8(e).

Then, similarly to the prior art example, when the row decoder 5 causes the word line WLn to go to an H level as shown in FIG. 8(a), and when the control signal WLref which belongs to a group of control signals inputted through the sense amplifier control signal bus 16 goes to an H level, the potential of the nodes 45 and 46 reach a stable state after a certain time has elapsed. In the stable state, the data line DLe and the reference data line DLrefe go to a potential Voff/Von and a potential Vref, respectively as shown in FIG. 8(e). Here, the potential Voff and the potential Von correspond respectively to the OFF state and the ON state of the nonvolatile memory cell.

Further, the data line DLa and the reference data line DLrefa in the sense amplifier block 3a having a configuration similar to FIG. 7 have a potential Vx and a potential Vref, respectively, as shown in FIG. 8(f).

Here, the potential Vx is set up such that the following relations hold for these potentials.

$$|Von-Vref|>|Vx-Vref|$$

$$|Voff-Vref|>|Vx-Vref|$$

Further, in order that these relations should hold in each block, the potential Vx is set up by controlling the cell current amount with respect to the memory cell block serving as an object of replacement in the case of redundancy replacement, and with respect to the redundant memory cell block in the case of no redundancy replacement. That is, the input potential difference to the differential amplifier circuit of the memory cell block serving as an object of replacement in the case of redundancy replacement or the redundant memory cell block in the case of no redundancy replacement is set to be the minimum among the input potential differences to the differential amplifier circuit of all the blocks.

In the nonvolatile memory of the present embodiment, a verifying process for adjusting the retained charge amount at a rewriting operation is performed in an inspection process after the redundancy relief determination. Further, in the volatile memory, a dedicated writing circuit is added, while means is provided for causing the writing circuit to operate continuously at a writing operation or a refresh operation with respect to the memory cell block serving as an object of replacement.

Then, similarly to the prior art example, when the sense amplifier activation signal SE goes to an H level as shown in FIG. 8(g), |Von−Vref| or |Voff−Vref| is amplified in the differential amplifier circuit in the redundant sense amplifier block 3e, while |Vx−Vref| is amplified in the differential amplifier circuit in the sense amplifier block 3a serving as an object of redundancy replacement.

Then, the read data De is outputted as shown in FIG. 8(h), while the read data DLa is outputted as an output enable signal as shown in FIG. 8(i). This output enable signal is data generated by reading the block having the minimum input potential difference to the differential amplifier circuit, and hence is outputted later than the read data of any other blocks.

Similarly to the prior art example, the output buffer 9 is controlled by the read data DLa which serves also as the output enable signal having been set to be outputted later than the read data of any other blocks in order that the transition should occur after the uncertainty duration T1 as shown in FIG. 8(i). As a result, the output buffer 9 is prevented from performing the output operation to the outside in the uncertainty duration T1. Thus, in the output enable signal selection circuit 20, the read data DLa is selected by a redundancy discrimination signal NERD, and then outputted as an output enable signal OE. As such, as indicated by numeral 71 of FIG. 8(j), the output data DOa–DOd is outputted without an uncertainty duration, so that the electric current consumption is reduced.

Further, similarly to the prior art example, in the output buffer 9, a bus switching operation is performed such that the read data corresponding to blocks having redundancy discrimination signals of H level among the redundancy discrimination signals NREDa–NREDe should be outputted.

(Embodiment 2)

Figure 2:
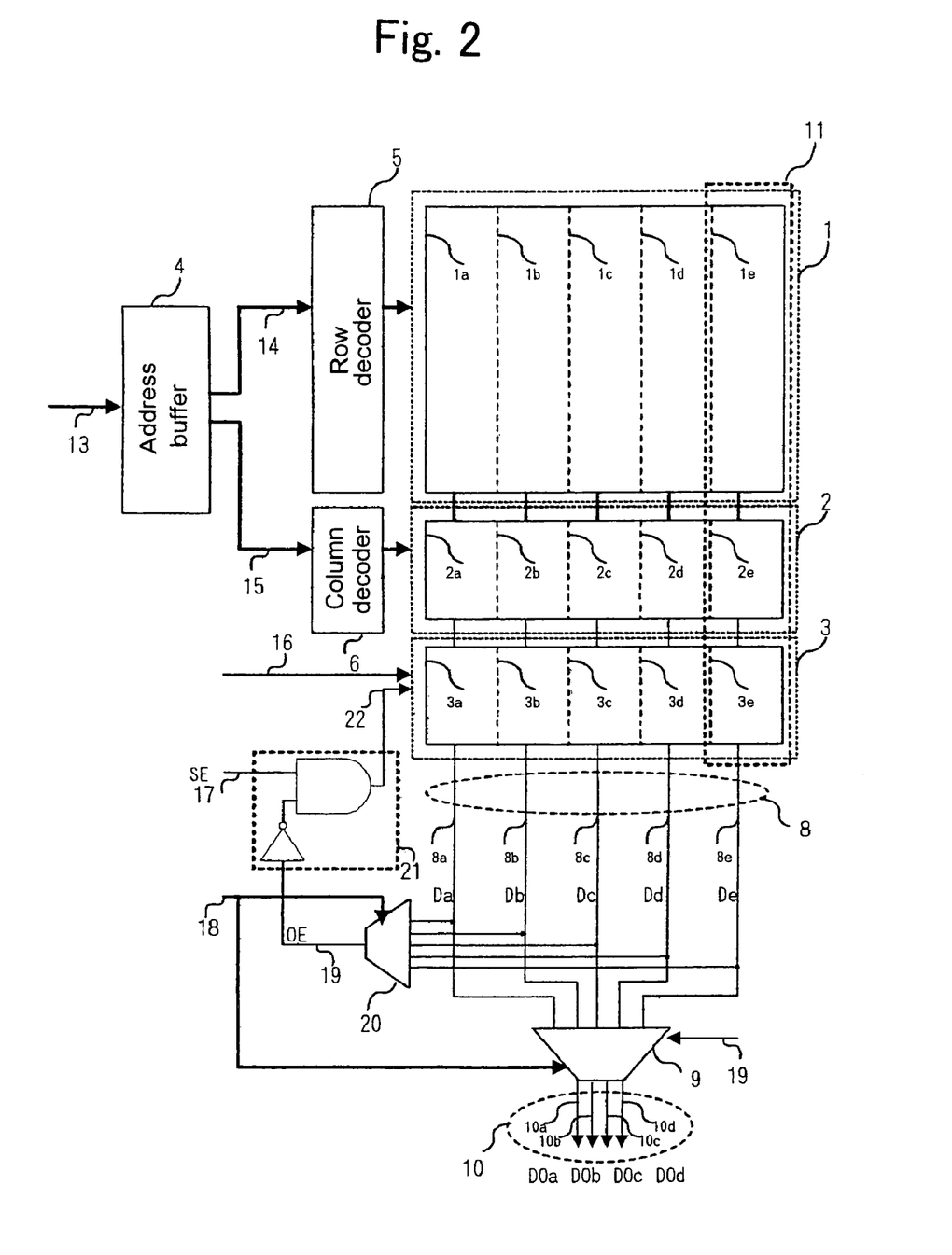
FIG. 2 is a block diagram showing the configuration of a read circuit of a semiconductor memory device according to Embodiment 2 of the invention in which electric current consumption is reduced in amplifying means.

FIG. 2 shows a block diagram of a read circuit of a semiconductor memory device according to Embodiment 2 of the invention. This semiconductor memory device has an external bit configuration specification of ×4 and an internal bit configuration of ×5 including redundancy. In the present embodiment, a sense amplifier activation signal feedback circuit 21 is added so that the prior art sense amplifier activation signal 17 and the output enable signal OE in the prior art are inputted to the sense amplifier activation signal feedback circuit 21. Then, the output of the sense amplifier activation signal feedback circuit 21 is inputted as a feedback sense amplifier activation signal 22 to the sense amplifier array 3. The configuration in the other points is similar to FIG. 1.

In the sense amplifier activation signal feedback circuit 21, the timing of start-up of the sense amplifier circuit is determined by the rise of the prior art sense amplifier activation signal 17, while the timing of stop is determined by the fall of the output enable signal OE.

The operation of the semiconductor memory device having the above-mentioned configuration according to the present embodiment is described below with reference to FIG. 8.

As shown in FIG. 8(i), the output enable signal transits to an L level immediately after the fixing of the read data. Thus, the feedback sense amplifier activation signal 22 transits faster than the transition of the sense amplifier activation signal SE into an L level the timing of which is set up with a time margin shown in FIG. 8(g). This reduces the electric current consumption in the sense amplifier circuit.

(Embodiment 3)

Figure 3:
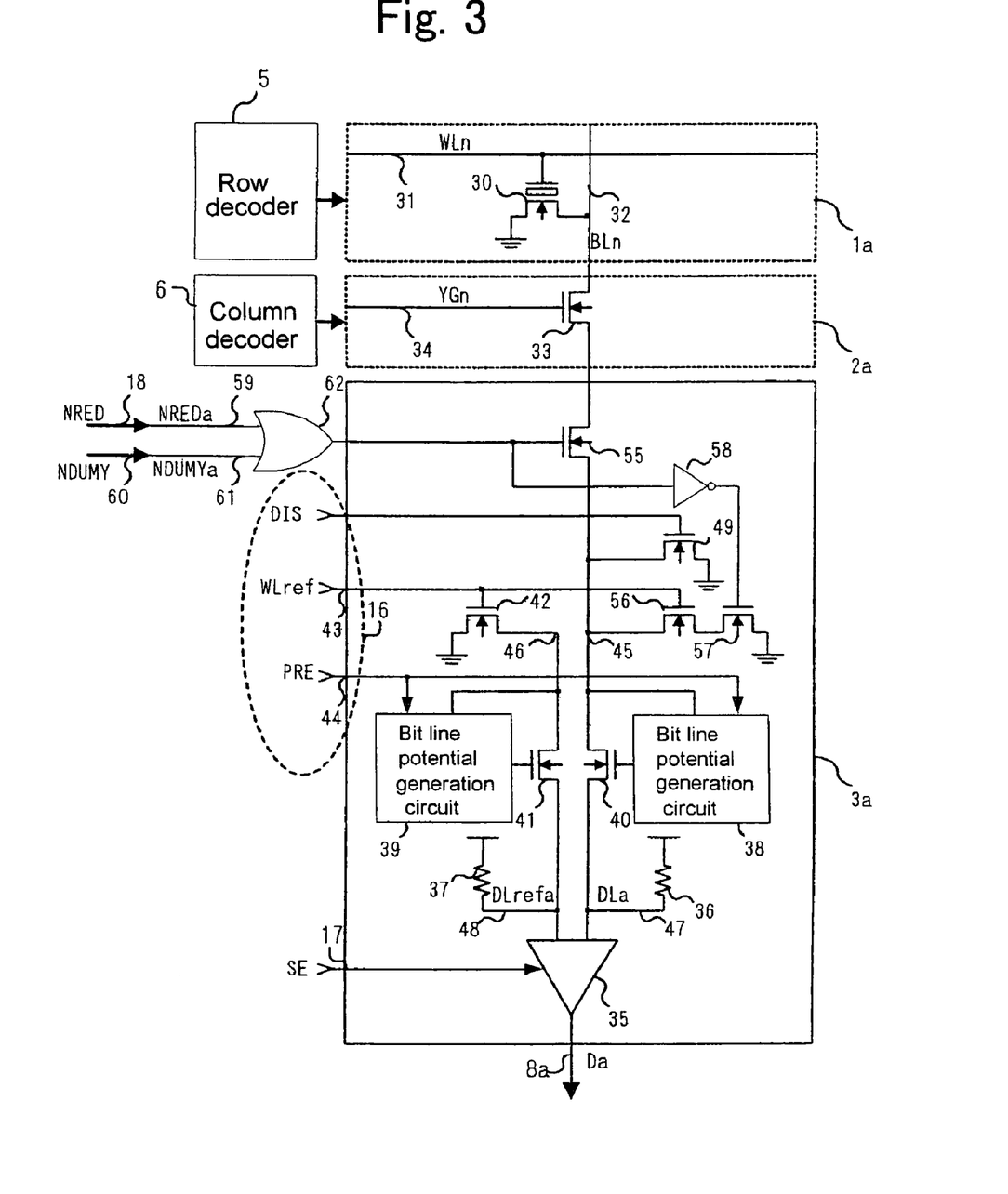
FIG. 3 is a circuit diagram showing a detailed configuration of a sense amplifier block according to Embodiment 3 of the invention in which a memory cell block is electrically disconnected.

FIG. 3 is a circuit diagram showing a detailed configuration of a memory cell block 1a, a column gate block 2a, and a sense amplifier block 3a according to Embodiment 3 of the invention. In FIG. 3, newly provided are: a cell current amount control discrimination signal bus 60 for inputting a cell current amount control discrimination signal NDUMY; a block-proper pass transistor 55; a dummy load element 56; a transistor 57 for activating the dummy load element 56; and logic elements 58 and 62 for controlling the block-proper pass transistor 55, the dummy load element 56, and the transistor 57 in response to the redundancy discrimination signal NRED and the cell current amount control discrimination signal NDUMY. Further, in response to the redundancy discrimination signal NREDa indicated by numeral 59 and the cell current amount control discrimination signal NDUMYa indicated by numeral 61 for the sense amplifier block 3a, the dummy load element 56 is activated when the block-proper pass transistor 55 is inactive. In the other points, the configuration of the present embodiment is similar to FIG. 7. It should be noted that the cell current amount control discrimination signal NDUMY is set at an L level solely for a block which becomes defective at a read operation after the cell current amount control of the memory cell block.

The operation of the semiconductor memory device having the above-mentioned configuration according to Embodiment 3 is described below with reference to FIGS. 3 and 4.

By virtue of the block-proper pass transistor 55, solely in the block where the redundancy discrimination signal NRED and the cell current amount control discrimination signal NDUMY are both at an L level, the memory cell block and the sense amplifier block are electrically disconnected. Thus, even when the word line is selected, no cell current flows from the memory cellblock. However, the dummy load element 56 provides a current as a dummy of the memory cell. The current capability of the dummy load element 56 is such that the potential Voff/Von and the potential Vref should be realized as shown in FIG. 4(*e*) similarly to the prior art case of setting the cell current amount of the dummy memory cell. Here, the potential Voff and the potential Von correspond respectively to the OFF state and the ON state of the nonvolatile memory cell.

Figure 4:
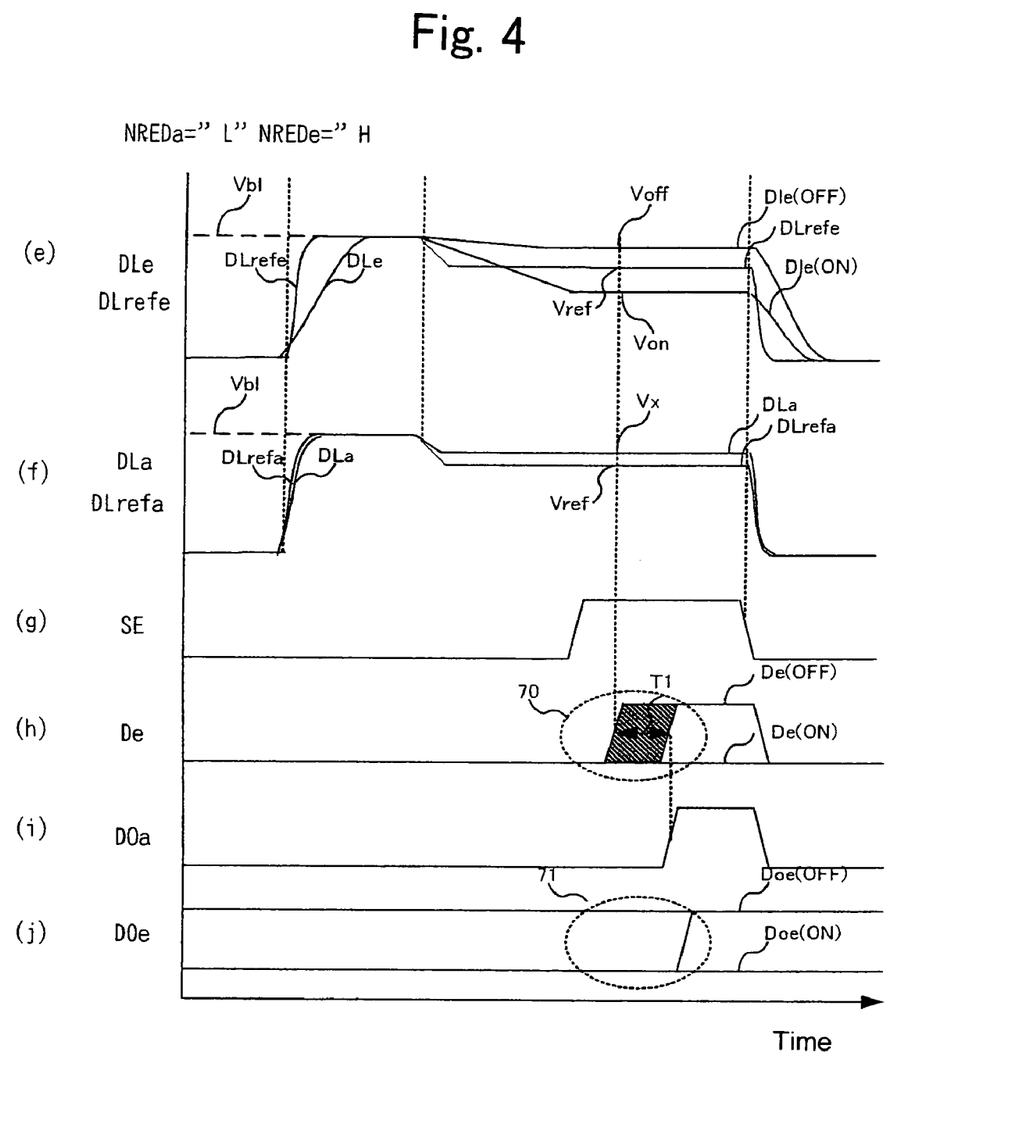
FIG. 4 is a timing chart showing a read operation in redundancy relief according to Embodiment 3 shown in FIG. 3.

Further, the data line DLa and the reference data line DLrefa in the sense amplifier block 3*a* go to the potential Vx and the potential Vref, respectively, as shown in FIG. 4(*f*).

These potential are set up such that the following relations hold.

|Von−Vref|>|Vx−Vref|

|Voff−Vref|>|Vx−Vref|

Similarly to the prior art example, the output buffer 9 is controlled by the read data DLa which serves also as the output enable signal having been set to transit after the uncertainty duration T1 as shown in FIG. 4(*i*). As a result, the output buffer 9 is prevented from performing the output operation to the outside in the uncertainty duration T1. Thus, in the output enable signal selection circuit 20, the read data DLa is selected by the redundancy discrimination signal NERD, and then outputted as the output enable signal OE. As such, as shown in FIG. 4(*j*), the output data DOa–DOd is outputted without an uncertainty duration, so that the electric current consumption is reduced.

According to this configuration, in the case of a semiconductor memory device in which the control of cell current amount is difficult, or alternatively in the case of such a kind of defect that a read operation after the cell current control cannot be performed in the memory cell block serving as an object of replacement in the case of redundancy replacement or in the redundant memory cell block in the case of no redundancy replacement, the memory cell block may be electrically disconnected. This avoids the influence of these factors.

Further, in FIG. 3, the sense amplifier control signal WLref provided to the gate of the dummy load element 56 is generated by an inner potential generation circuit having an adjustable potential. In this configuration, current adjustment is possible after the redundancy replacement. This permits the correction of a fabrication variation, and hence reduces the electric current consumption.

Further, in FIG. 3, when the sense amplifier control signal WLref is controlled into an H level in all the blocks similarly to the sense amplifier control signal DIS after the completion of a read operation, the bit line BLn and the node 45 are discharged through the discharging transistor 49 and the dummy load element 56. According to this configuration, the discharge can be performed with a smaller current capability of the discharging transistor 49 by the amount of the current capability of the dummy load element 56. This reduces the size of the necessary discharging transistor.

(Embodiment 4)

Figure 5:
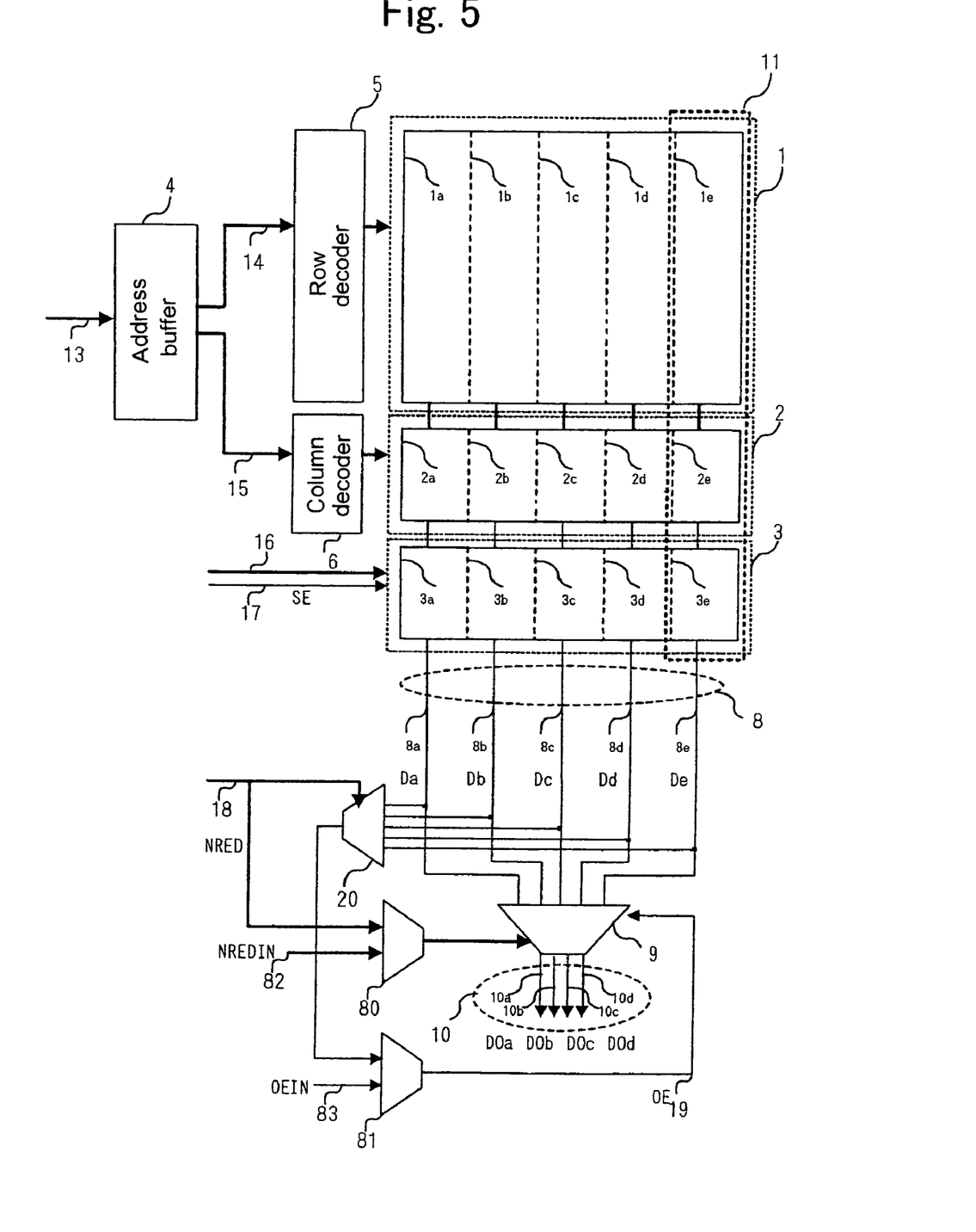
FIG. 5 is a block diagram showing the configuration of a read circuit of a semiconductor memory device according to Embodiment 4 of the invention in which an output enable signal is externally observed.

In the present embodiment, as shown in FIG. 5, further provided are: a redundancy discrimination signal selection circuit 80; an output enable signal selection circuit 81; an external input redundancy discrimination signal line 82 for inputting an external input redundancy discrimination signal NREDIN; and an external input output enable signal line 83 for inputting an external input output enable signal OEIN. The configuration in the other points is similar to FIG. 1.

According to this configuration, the output enable signal OE is fixed to an H level by the external output enable signal OEIN. Further, when two signals in the five redundancy discrimination signals NRED are set at an L level in two separate read operations by the external input redundancy discrimination signal NREDIN respectively, all of the five waveforms on the read data bus 8 including the output enable signal can be observed externally. This permits the screening of the waveforms before the shipment. Thus, when fabrication defect occurs in the output enable signal, the output enable signal OE may be fixed at an H level so that the product article may be recovered depending on the value of the electric current consumption. This reduces the fabrication cost.

INDUSTRIAL APPLICABILITY

The semiconductor memory device according to the invention is a semiconductor memory device employing a redundancy replacement method with respect to bit configuration in which regardless of the actual execution or not of redundancy replacement, a circuit not used after the redundancy replacement is effectively used as a dummy circuit. This realizes the effect that under the condition that an increase in the area is suppressed, an output buffer outputs data without an uncertainty duration without a degradation in the read speed at a low electric current consumption. Thus, the invention is useful, for example, as a rewritable semiconductor memory device having redundant capacity.

What is claimed is:

1. A semiconductor memory device comprising:
    a plurality of memory cell blocks including a redundant memory cell block;
    selecting means for selecting one memory cell from each of said memory cell blocks depending on an inputted address;
    plural pieces of amplifying means each provided in correspondence to each of said memory cell blocks so as to read data of the memory cell selected by said selecting means;
    a plurality of data buses each connected to each of plural pieces of said amplifying means;
    read data outputting means for outputting plural pieces of read data through a plurality of said data buses to the outside; and
    redundancy discrimination signal inputting means for inputting a redundancy discrimination signal for discriminating a memory cell block serving as an object of redundancy replacement among a plurality of said memory cell blocks, wherein
    in response to said redundancy discrimination signal, in case of redundancy replacement, said read data outputting means outputs read data excluding the read data of said memory cell block serving as an object of redundancy replacement, while in case of no redundancy replacement, said read data outputting means outputs read data excluding the read data of said redundant memory cell block among a plurality of said memory cell blocks, and wherein
    the read data excluded by said read data outputting means is used as a memory control signal.

2. A semiconductor memory device according to claim 1, wherein said memory control signal is inputted to said read data outputting means as an output enable signal.

3. A semiconductor memory device according to claim 1, wherein said memory control signal is inputted to plural pieces of said amplifying means as an activation signal.

4. A semiconductor memory device according to claim 1, wherein in the case of redundancy replacement, cell current amount control is performed for the memory cells of said memory cell block serving as an object of redundancy replacement, while in the case of no redundancy replacement, cell current amount control is performed for the memory cells of said redundant memory cell block.

5. A semiconductor memory device according to claim 4, comprising cell current amount control discrimination signal inputting means for inputting a cell current amount control discrimination signal for discriminating permission or inhibition of a read operation after the cell current amount control in correspondence to each of said memory cell blocks, and further comprising a plurality of dummy elements each connected to an input terminal of each of plural pieces of said amplifying means in correspondence to each of plural pieces of said amplifying means, wherein in case of redundancy replacement, solely in said memory cell block serving as an object of redundancy replacement, a drain node of a selected memory cell is electrically disconnected from the input terminal of the amplifying means corresponding to said memory cell block serving as an object of redundancy replacement among plural pieces of said amplifying means, in response to said redundancy discrimination signal and said cell current amount control discrimination signal, while in case of no redundancy replacement, solely in said redundant memory cell block, a drain node of said selected memory cell is electrically disconnected from the input terminal of the amplifying means corresponding to said redundant memory cell block among plural pieces of said amplifying means in response to said redundancy discrimination signal and said cell current amount control discrimination signal, and wherein said dummy element connected to said amplifying means the input terminal of which is electrically disconnected from the drain node of said selected memory cell is solely activated in a read duration.

6. A semiconductor memory device according to claim 5, wherein each of said dummy elements is composed of a transistor, while an internal generation potential is provided to said transistor as a gate voltage.

7. A semiconductor memory device according to claim 5, wherein a plurality of said dummy elements are activated after completion of a read duration.

8. A semiconductor memory device according to claim 2, wherein said read data outputting means is controlled by said redundancy discrimination signal and said output enable signal inputted through external input terminals, and thereby selectively outputs read data containing said excluded read data, to the outside.

* * * * *